United States Patent
Yeh

(10) Patent No.: US 7,867,006 B2
(45) Date of Patent: Jan. 11, 2011

(54) LAND GRID ARRAY SOCKET HAVING SIMPLIFIED FASTENING DEVICE BENT BY METALLIC STRIPE

(75) Inventor: Cheng-Chi Yeh, Tu-Cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/485,064

(22) Filed: Jun. 16, 2009

(65) Prior Publication Data
US 2009/0311901 A1  Dec. 17, 2009

(30) Foreign Application Priority Data
Jun. 16, 2008  (TW) .................. 97210591

(51) Int. Cl.
*H01R 13/62* (2006.01)
(52) U.S. Cl. ..................................... 439/331
(58) Field of Classification Search .......... 439/331, 439/332; 72/135
See application file for complete search history.

(56) References Cited

U.S. PATENT DOCUMENTS

| | | | |
|---|---|---|---|
| 7,001,197 B2 * | 2/2006 | Shirai et al. ................. | 439/331 |
| 7,083,457 B2 * | 8/2006 | Ma ........................... | 439/331 |
| 7,134,898 B2 * | 11/2006 | Ma ........................... | 439/342 |
| 7,179,109 B1 * | 2/2007 | Ma ........................... | 439/331 |
| 7,189,094 B2 * | 3/2007 | Ma ........................... | 439/331 |
| 7,217,149 B2 * | 5/2007 | Ma ........................... | 439/331 |
| 7,247,041 B2 | 7/2007 | Ma et al. | |
| 7,275,950 B1 * | 10/2007 | Ma et al. ..................... | 439/342 |
| 7,476,115 B2 * | 1/2009 | Zhang et al. ................ | 439/331 |
| 7,588,442 B2 * | 9/2009 | Ma ........................... | 439/73 |
| 7,699,637 B2 * | 4/2010 | Yeh ........................... | 439/331 |

* cited by examiner

Primary Examiner—Chandrika Prasad
(74) Attorney, Agent, or Firm—Andrew C. Cheng; Wei Te Chung; Ming Chieh Chang

(57) ABSTRACT

A land grid array (LGA) connector includes an insulative housing, a number of contacts received in the insultive housing, a stiffener disposed around the insulative housing, a metallic clip rotatably mounted to the stiffener, and a lever rotatably mounted to the stiffener to lock the metallic clip to the stiffener. The insulative housing defines a substantially rectangular cavity in a middle thereof adapted for receiving an electronic package therein. The metallic clip is disposed against the housing to press the electronic package upon the contacts. The metallic clip is configured by a single strip with a predetermined arrangement and then formed through bending.

16 Claims, 4 Drawing Sheets

LAND GRID ARRAY SOCKET HAVING SIMPLIFIED FASTENING DEVICE BENT BY METALLIC STRIPE

BACKGROUND OF THE INVENTION

1. Field of the Invention

The present invention relates to a land grid array socket connector, and more particularly to a land grid array socket having simplified fastening structure in which at least one of a metallic clip and a stiffener is configured by a metallic strip formed into a predetermined configuration.

2. Description of the Prior Art

U.S. Pat. No. 7,001,197 issued to Shirai on Feb. 21, 2006 discloses a type of socket, which can be generally called land grid array (LGA) socket. As clearly shown in Figures, the socket generally includes a metal stiffener with a housing securely supported therein. A metal clip is pivotally assembled to the stiffener. On the other hand, a lever is pivotally assembled to the other side of the stiffener, when the clip is closed to the stiffener, the lever can lock the clip to a closed position. By this arrangement, the clip will tightly press a central process unit (CPU) which is seated on the housing toward the housing and ensure proper electrical connection therebetween.

U.S. Pat. No. 7,247,041 issued to Ma on Jul. 24, 2007 discloses another typical socket assembly, which has a LGA connector according to an embodiment of the present invention. The LGA connector includes an insulative housing, a stiffener coupled to the housing, and a plurality of ribs projecting from a periphery edge of the housing. The stiffener defines an opening for surrounding the housing. Each of the ribs has a base defining a mating surface and a mounting surface. The stiffener is coupled to the housing by the mating surface abutting against a wall face of the opening of the stiffener, and the mounting surface resting on a peripheral edge of the stiffener.

From the above disclosures of the prior arts, it can be readily found out that all the clip and the stiffener are stamped from a single metallic sheet, normally, from stainless steel plate. It inevitably costs a lot since the middle portions of both the clip and the stiffener are wasted. In view of reducing the cost so as to meet the market trend, it therefore requires a new and useful configuration for the clip or the stiffener.

In view of reducing the material cost, a new way to configure either the metallic clip or the stiffener with a simplified configuration is needed.

SUMMARY OF THE INVENTION

Accordingly, an object of the present invention is related to a land grid array socket which having a simplified fastening structure for reducing metal material for a metallic clip or a stiffener thereof.

In order to achieve the object set forth, a land grid array (LGA) connector comprises an insulative housing, a plurality of contacts received in the insulative housing, a stiffener surrounding the insulative housing, a metallic clip rotatably mounted to the stiffener. The insulative housing defines a substantially rectangular cavity in a middle thereof, the cavity is adapted for receiving an electronic package therein. The metallic clip is disposed upon the housing to press the electronic package against the contacts. The metallic clip is configured by a single strip with a predetermined arrangement and then bent to form a frame configuration with a gap on a side.

In order to further achieve the object set forth, a method for forming a metallic clip comprises the steps of: 1) providing a metallic strip; 2) dividing the metallic strip into a first, a second, a third, a fourth, and a fifth sections, each section carrying with a pre-determined arrangements; and 3) forming the first, the second, the third, the fourth and the fifth sections into a substantially rectangular frame configuration.

DESCRIPTION OF PREFERRED EMBODIMENT

Reference will now be made to the drawings to describe the present invention in detail.

Figure 1:
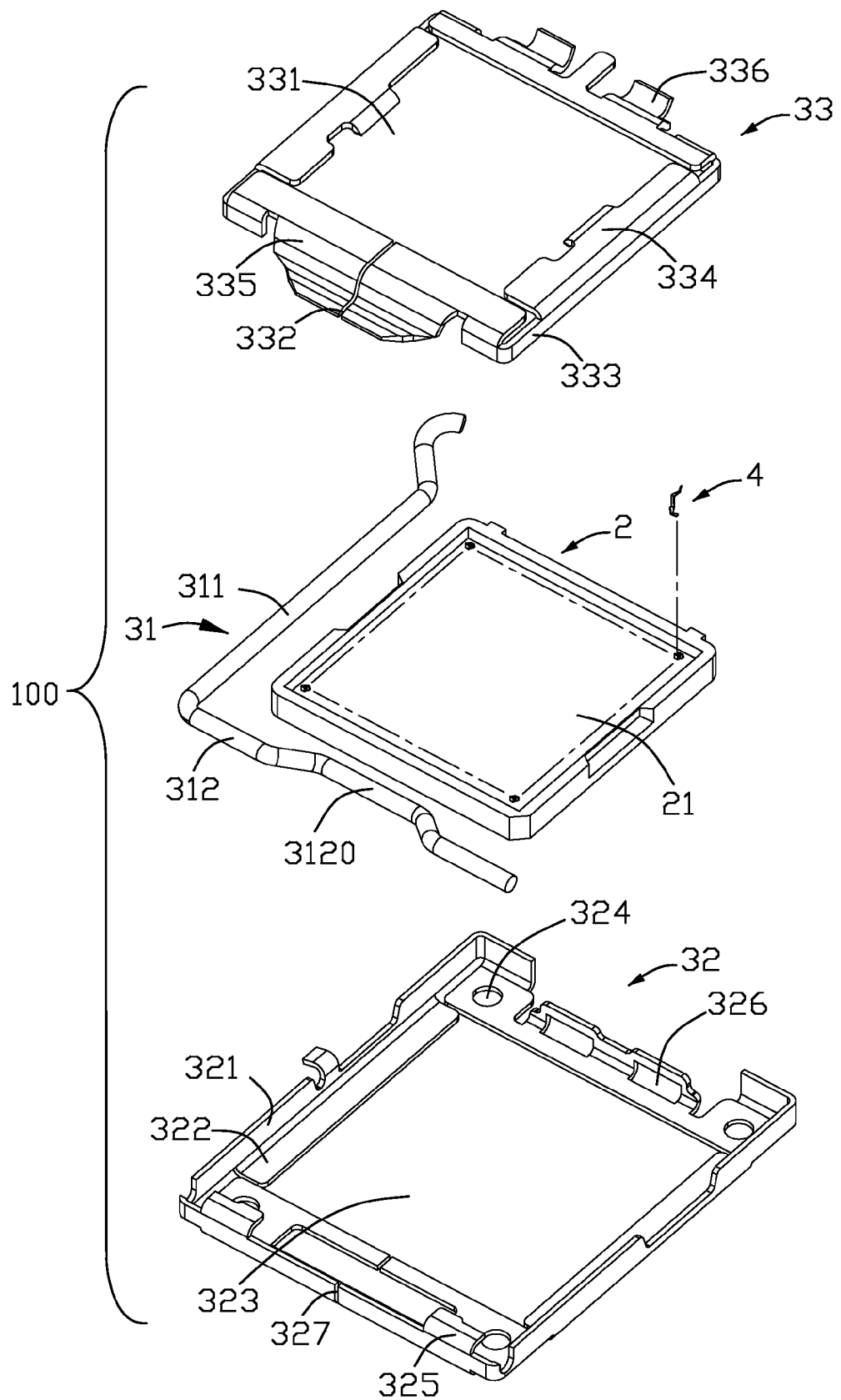
FIG. 1 is an exploded perspective view of a land grad array connector according to the present invention.
Figure 2:
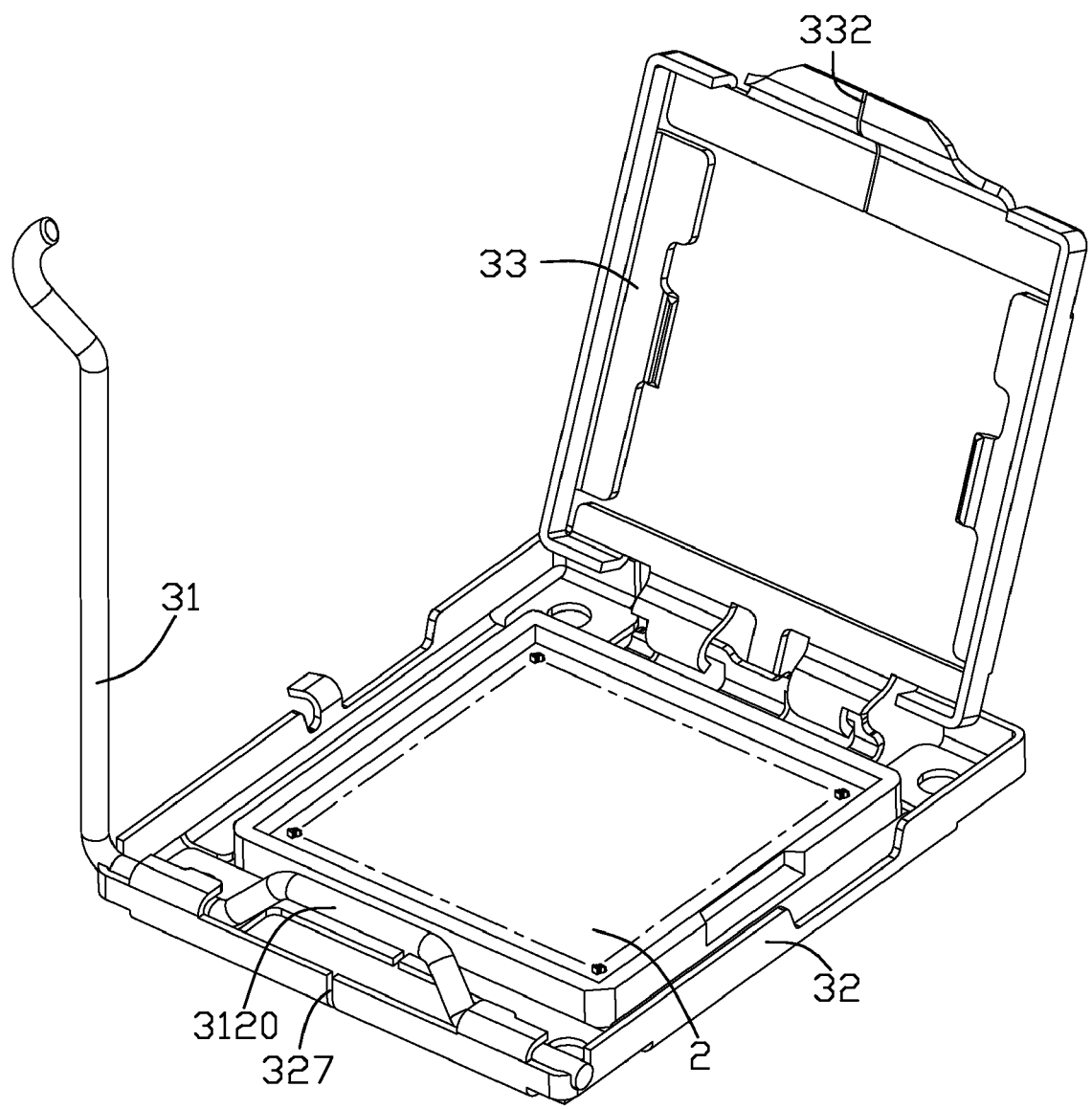
FIG. 2 is an assembled perspective view of the land grad array connector of FIG. 1.

FIG. 1 shows a land grad array connector 100 for electrically connecting a printed circuit board (not shown) to an electronic package (not shown). The connector 100 comprises an insulative housing 2, a plurality of contacts 4 retained in the insulative housing 2 and a fastening structure assembled around the insulative housing 2 for pressing the electronic package (not shown) to touch the contacts 4.

The insulative housing 2 is formed with a rectangular shape and molded from resin or the like. The insulative housing 2 has a receiving space 21 thereof for receiving the electronic package (not shown).

The fastening structure including a stiffener 32 surrounding the insulative housing 2, a metallic clip 33 assembled to one end of the stiffener 32 and a lever 31 assembled to an opposite end of the stiffener 32.

The stiffener 32 has a rectangular configuration with four sidewalls in a front, a rear, a right and a left directions. Each sidewall comprises a vertical sidewall 321 in a vertical direction and a horizontal sidewall 322 extending inwardly and is perpendicular to the vertical sidewall 321. The four vertical walls 321 are connected with one by one, and the four horizontal sidewalls 322 are separated with each other. The four horizontal sidewalls 322 jointly define an opening 323 in a center. A pair of holes 324 are defined on each of the front and the rear horizontal sidewalls 322 at opposite ends of the stiffener 32. The connector 100 is secured on the printed circuit board (not shown) by a plurality of connecting parts (not shown) passing through the holes 324 of the stiffener 32. A pair of retaining portions 325 extend inwardly from the front vertical sidewall 321 for assembling the lever 31. A pair of latching slots 326 are defined on the rear horizontal sidewall 322 for assembling the metallic clip 33. A gap 327 is defined at a middle of the front sidewall connecting with the lever 31.

The metallic clip 33 is made of a metal plate and has an opening 331 at a center thereof for receiving the electronic package (not shown). The metallic clip 33 has four sidewalls at a front, a rear, a right and a left directions corresponding to the sidewalls of the stiffener 32, and one of the sidewall has a gap 332. Each sidewall further comprises a vertical sidewall 333 at the vertical direction and a horizontal sidewall 334 extending inwardly and is perpendicular to the vertical sidewall 333. The vertical sidewalls 333 are connected with each other in the corner of the metallic clip 33. A locking element 335 projects downwardly from a middle of the front horizontal sidewall 334 of the metallic clip 33 for mating with the lever 31. A pair of bearing tongues 336 are curved downwardly from the rear horizontal sidewall 334 of the metallic clip 33 for engaging with the latching slots 326 of the stiffener 32. The gap 332 is preferably defined at a middle of the front sidewall of the metallic clip 33.

In the present embodiment, each sidewall of the stiffener 32 or the metallic clip 33 comprises one vertical sidewall and one horizontal sidewall, however, the horizontal sidewall is not a necessary part to each sidewall, it also can be partially defined on the sidewalls according to the embodiments.

The lever 31 is formed with an L-shaped configuration and comprises an actuating portion 311 and a retaining portion 312 with a locking portion 3120 disposed at the middle of the retaining portion 312. The retaining portion 312 is engaged with the retaining portions 325 of the stiffener 32 and the locking portion 3120 is pressed on the locking element 335 of the metallic clip 33 for locking the metallic clip 33 to the stiffener 32.

The stiffener 33 and the metallic clip 32 can be both configured by a single metal strip with predetermined arrangement and then bent to form a frame shape. The manufacture methods of the metallic clip 32 and the stiffener 33 are similarly, so the present invention just illuminates the manufacture methods the stiffener 33.

Figure 3:
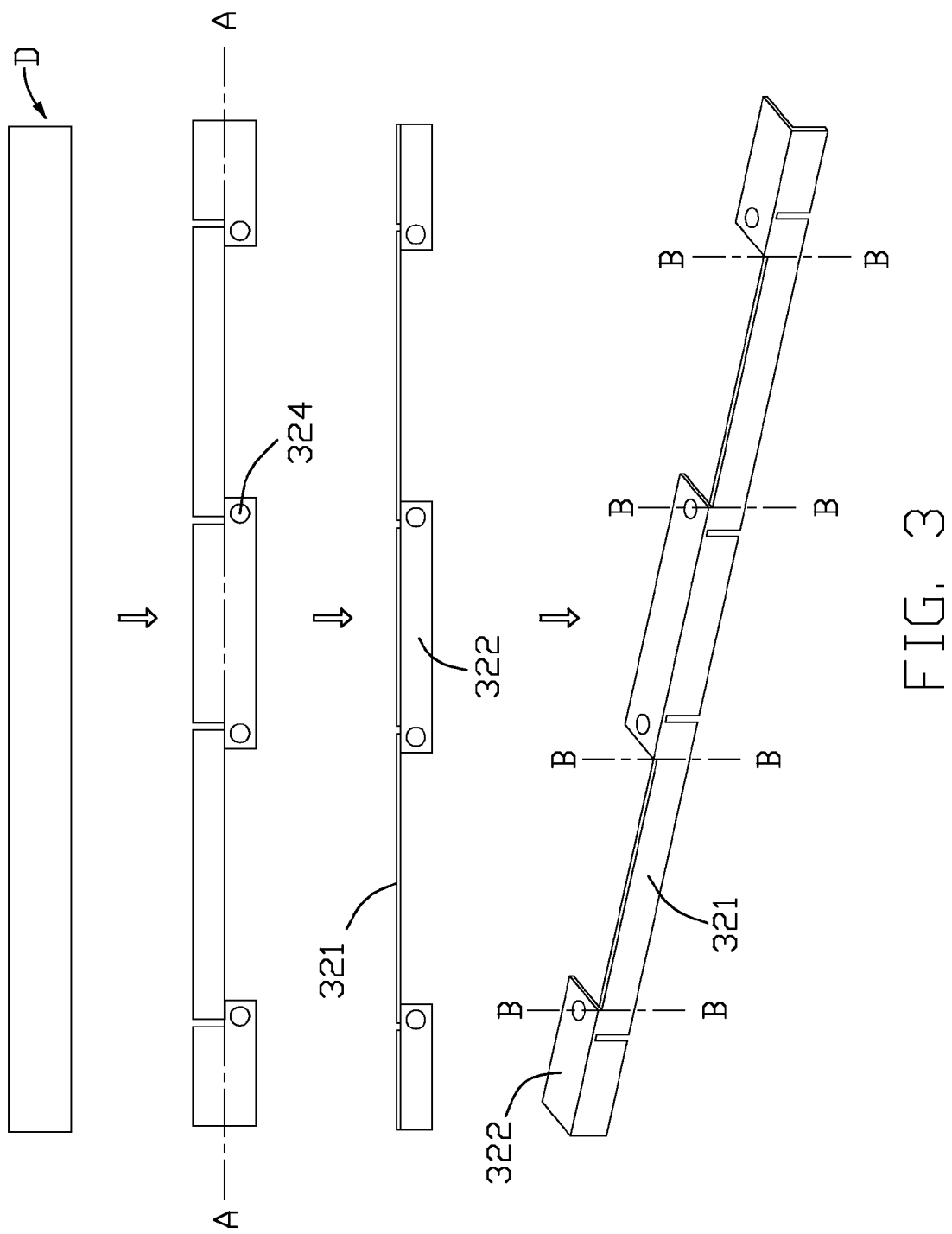
FIG. 3 is a schematic view of manufacturing steps of a stiffener of the land grad array connector according to the present invention.
Figure 4:
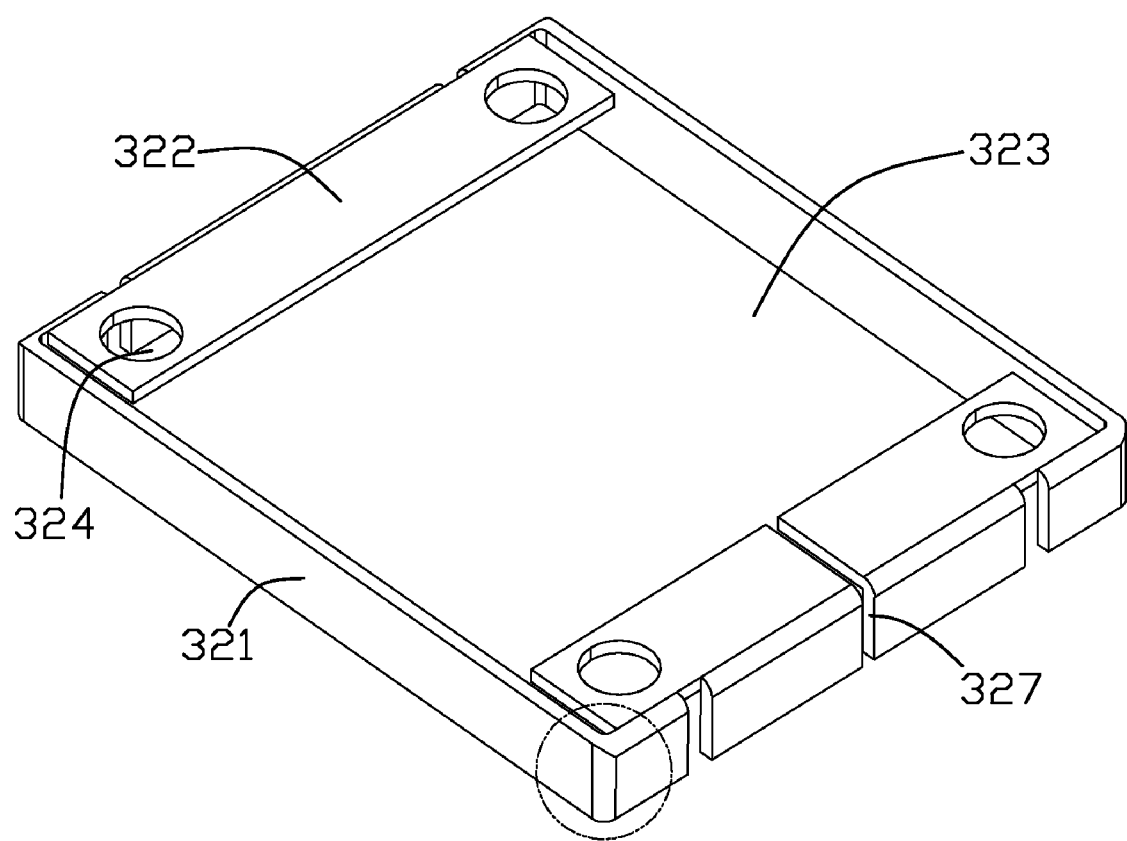
FIG. 4 is a perspective view of the stiffener in FIG. 3.

FIG. 3 and FIG. 4 shows the method for forming the stiffener 33 comprising the steps as follows: providing a metallic strip D and dividing the metallic strip D into a first, a second, a third, a fourth, and a fifth sections, each carrying with a predetermined arrangement, for example the holes 324 formed by punching, and then bending the metallic strip D along a line A-A in a lengthwise direction for forming the vertical sidewalls 321 and the horizontal sidewalls 322, after that, bending the metallic strip D along the lines B-B in a vertical direction for forming a substantially rectangular frame configuration in which the first and the fifth section jointly configure a side of the frame configuration. In the present invention, the four vertical sidewalls 321 joint with each other on the corners, referring to a circle of FIG. 7. The first and the fifth sections are located on one side, so that a gap 327 is formed between the first and the fifth sections. Because the gap 327 is substantially as a linear shape, a well integral and robust rigidity of the stiffener 32 is provided. The first and the fifth sections also can be connected together by methods of riveting, welding, buckling and so on, so that there may be no gap 327 between the first and the fifth sections.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A land grid array (LGA) connector, comprising:
   an insulative housing defining a substantially rectangular cavity in a middle thereof, the cavity being adapted for receiving an electronic package therein;
   a plurality of contacts received in the insulative housing;
   a stiffener surrounding the insulative housing; and
   a metallic clip rotatably mounted to the stiffener and disposed upon the housing for pressing the electronic package against the contacts, the metallic clip configured by a single strip with a predetermined arrangement and then bent to have a frame configuration, which has a gap extending through one side thereof in a vertical direction.

2. The LGA connector as claimed in claim 1, wherein the metallic clip comprises four sidewalls, and each sidewall has a vertical sidewall, and a plurality of horizontal sidewalls are provided and connected with the vertical sidewalls.

3. The LGA connector as claimed in claim 2, wherein the vertical sidewalls are connected with each other on the corner of the metallic clip.

4. The LGA connector as claimed in claim 1, wherein the single strip with a predetermined arrangement is formed by punching, and the metallic strip is divided into a first, a second, a third, a fourth and a fifth sections.

5. The LGA connector as claimed in claim 4, wherein the metallic strip is bent along a line in a lengthwise direction at first to form vertical sidewalls and horizontal sidewalls perpendicular to the vertical sidewalls.

6. The LGA connector as claimed in claim 5, wherein the metallic strip is further bent along lines in a vertical direction to form the first, the second, the third, the fourth and the fifth sections into a substantially rectangular frame configuration, in which the first and the fifth sections jointly configures a side of the frame configuration.

7. The LGA connector as claimed in claim 1, wherein the stiffener is substantially same configured as the metallic strip.

8. The LGA connector as claimed in claim 7, further comprising a lever formed with an L-shaped configuration and mounted to the stiffener.

9. The LGA connector as claimed in claim 1, wherein the gap is configured to have a substantially linear form, and two opposite sides of the gap are connected by riveting, welding or bucking.

10. An electrical connector comprising:
    an insulative housing defining opposite front and rear ends thereof in a front-to-back direction;
    a metallic stiffener surrounding said housing;
    a metallic clip pivotally mounted to the stiffener and covering the housing;
    said stiffener being configured with four side walls which are formed by bending a strip type metal with four right angles to form a rectangular opening under condition that two opposite free ends of said strip type metal are seamed together, and at least a pair of opposite horizontal plates located adjacent to the corresponding front and rear ends of the housing and unitarily extending, in said front-to-back direction, from the corresponding adjacent side walls, respectively, wherein
    each of said pair of opposite plates is only mechanically connected to the single one corresponding side wall in said front-to-back direction without any other transverse linkage with the other side walls.

11. The electrical connector as claimed in claim 10, wherein each of said opposite plates defines a through hole for fastening said stiffener to a printed circuit board.

12. The electrical connector as claimed in claim 10, wherein said clip is of a strip type metal to form said four side walls via four right angle bend.

13. An electrical connector comprising:
    an insulative housing defining opposite front and rear sides thereof in a front-to-back direction and opposite left and right sides thereof in a transverse direction perpendicular to said front-to-back direction;
    a metallic stiffener surrounding said housing;
    a metallic clip pivotally mounted to the stiffener and covering the housing;

at least one of said stiffener and said clip being configured with opposite front and rear side walls and opposite left and right side walls, corresponding to said front and rear sides and the left and right sides of the housing, which are formed by bending a strip type metal with four right angles to form a rectangular opening to enclose said housing under condition that two opposite free ends of said strip type metal are seamed together, and at least a pair of opposite horizontal plates unitarily extending respectively toward each other from either the corresponding adjacent front and rear side walls in the front-to-back direction or the corresponding adjacent left and right side walls in the transverse direction; wherein
the front and rear side walls and the left and right side walls are alternately linked with one another transversely.

14. The electrical connector as claimed in claim 13, wherein each of said pair of opposite plates is only mechanically connected to the single one corresponding side wall without any other transverse linkage with the other side walls.

15. The electrical connector as claimed in claim 13, wherein said at least one of said stiffener and said clip is the stiffener and each of said opposite plates defines a through hole for fastening said stiffener to a printed circuit board.

16. The electrical connector as claimed in claim 13, wherein each of said stiffener and said clip is of a strip type metal to form said four side walls via four right angle bend.

* * * * *